United States Patent
Chang

(10) Patent No.: US 7,064,035 B2
(45) Date of Patent: Jun. 20, 2006

(54) MASK ROM AND FABRICATION THEREOF

(75) Inventor: Ching-Yu Chang, Yilan Hsien (TW)

(73) Assignee: MACRONIX International Co., Ltd., Hsinchu (TW)

( * ) Notice: Subject to any disclaimer, the term of this patent is extended or adjusted under 35 U.S.C. 154(b) by 119 days.

(21) Appl. No.: 10/888,104

(22) Filed: Jul. 9, 2004

(65) Prior Publication Data

US 2004/0256682 A1   Dec. 23, 2004

Related U.S. Application Data

(62) Division of application No. 10/065,645, filed on Nov. 5, 2002, now Pat. No. 6,777,762.

(51) Int. Cl.
    *H01L 21/8236*  (2006.01)
(52) U.S. Cl. ..................... 438/278; 438/275
(58) Field of Classification Search ............... 438/278, 438/290, 128–130, 275
    See application file for complete search history.

(56) References Cited

U.S. PATENT DOCUMENTS 6,713,315 B1 *  3/2004  Kuo et al. .................... 438/72

FOREIGN PATENT DOCUMENTS

| JP | 06-013628 | 1/1994 |
|---|---|---|
| JP | 07-045797 | 2/1995 |
| JP | 08-162547 | 6/1996 |
| JP | 2870478 | 1/1999 |
| JP | 2000-514946 | 11/2000 |
| JP | 2001-077219 | 3/2001 |
| JP | 2001-077220 | 3/2001 |

OTHER PUBLICATIONS

Chen, J. T-Y. et al. (2000). "A New Dual Floating Gate Flash Cell for Multilevel Opertion," *Extended Abstracts of the 2000 International Conference on Solid State Devices and Materials*, Abstract C-5-4, ppg. 282-283.

* cited by examiner

Primary Examiner—Douglas W. Owens
(74) Attorney, Agent, or Firm—J.C. Patents

(57) ABSTRACT

A Mask ROM and a method for fabricating the same are described. The Mask ROM comprises a substrate, a plurality of gates on the substrate, a gate oxide layer between the gates and the substrate, a plurality of buried bit lines in the substrate between the gates, an insulator on the buried bit lines and between the gates, a plurality of word lines each disposed over a row of gates perpendicular to the buried bit lines, and a coding layer between the word lines and the gates.

9 Claims, 2 Drawing Sheets

MASK ROM AND FABRICATION THEREOF

CROSS-REFERENCE TO RELATED APPLICATION

This application is a divisional application of, and claims the priority benefit of, U.S. application Ser. No. 10/065,645 filed on Nov. 05, 2002 now U.S. Pat. No. 6,777,762.

BACKGROUND OF THE INVENTION

1. Field of Invention

The present invention relates to a memory structure and a method for fabricating the same. More particularly, the present invention relates to a structure of a mask programmable read-only memory (Mask ROM) and a method for fabricating the same.

2. Description of Related Art

A Mask ROM generally comprises a substrate, a plurality of buried bit lines in the substrate and a plurality of word lines crossing over the buried bit lines, wherein the substrate under the word lines and between the buried bit lines serves as the channel regions of the memory cells. A method for programming a Mask ROM comprises implanting ions into the channel regions of selected memory cells to raise their threshold voltages, which is called a coding implantation. The data (0/1) stored in a memory cell is dependent on the presence/absence of implanted dopants in the channel region.

In a conventional coding process of a Mask ROM, a photoresist layer is formed on the substrate and then patterned to form coding windows over the channel regions of selected memory cells. An ion implantation is then performed using the photoresist layer as a mask to dope the selected channel regions. However, since the coding windows do not distribute evenly and there must be some regions with dense coding window patterns (dense regions) and some with isolated coding window patterns (sparse regions) on the coding photo mask, the critical dimensions (CD) of the coding windows are not uniform. It is because the optical proximity effect (OPE) for the dense regions is stronger than that for the isolated regions, and the light intensity through the dense regions therefore is higher than that through the sparse regions. The CD deviations of coding windows cause misalignments of the coding implantation, which may results in severe coding errors to lower the reliability of the Mask ROM product.

To prevent CD deviations over the sparse regions and the dense regions, quite a few methods are proposed based on the use of phase shift masks (PSM) or on optical proximity correction (OPC) techniques. The OPC method forms assistant patterns on the photo mask to compensate the CD deviations caused by the optical proximity effect (OPE). However, the two methods both need to design special patterns on the photo masks, so the fabrication of the photo masks are time-consuming, expensive and difficult. Moreover, it is not easy to debug the patterns on such a photo mask after the photo mask is fabricated.

Moreover, a Mask ROM coding implantation is usually performed with boron ions in the prior art. However, the boron dopants implanted into the selected channel regions tend to diffuse laterally to the adjacent buried bit lines, while the boron ions may even be implanted into a portion of the adjacent buried bit lines because of the misalignments or CD deviations of the coding mask. Therefore, the dopant concentrations of the buried bit lines are lowered to cause higher resistance and smaller electric current.

SUMMARY OF THE INVENTION

Accordingly, this invention provides a Mask ROM and the fabrication thereof to prevent diffusion of the implanted coding dopants into the buried bit lines and thereby avoid the current in the buried bit lines from decreasing.

This invention also provides a Mask ROM and the fabrication thereof to improve the coding accuracy without using phase shift masks (PSM) or optical proximity correction (OPC), so as to reduce the cost for fabricating the photo mask.

A Mask ROM of this invention comprises a substrate, a gate dielectric layer, a plurality of gates, a plurality of buried bit lines, an insulator, a plurality of word lines and a coding layer. The gates are disposed over the substrate, and the gate dielectric layer is disposed between the substrate and the gates. The buried bit lines are located in the substrate between the gates, and the insulator is disposed on the buried bit lines and between the gates. Each word line is disposed over a row of gates and the insulator perpendicular to the buried bit lines. The coding layer is disposed between the word lines and the gates to constitute the coding regions of a plurality of memory cells, and comprises a material such as semiconductor. Some memory cells are implanted with coding ions and are in a logic state of 1 (or 0), and the other memory cells are not implanted with coding ions and are in a logic state of 0 (or 1).

A method for fabricating a Mask ROM of this invention is described as follows. A gate dielectric layer is formed on a substrate, and then a strip conductive structure is formed on the gate dielectric layer. An ion implantation is performed using the strip conductive structure as a mask to form a buried bit line in the substrate beside the strip conductive structure. Thereafter, the strip conductive structure is patterned perpendicular to the buried bit line to form a plurality of gates. An insulator is formed between the gates by, for example, forming an insulating layer on the substrate covering the gates and then performing a CMP process or an etching-back process to remove a portion of the insulating layer until the gates are exposed. Then, a material layer and a conductive layer are sequentially formed over the gates and the insulator, wherein the material layer comprises a material such as semiconductor. The conductive layer and the material layer are sequentially patterned to form a word line over a gate perpendicular to the buried bit line and a coding layer under the word line, wherein the coding layer between the word line and the gate constitutes a coding region of a memory cell. A coding mask is formed on the substrate. An implantation is then performed using the coding mask as a mask to dope selected memory cells, wherein the selected memory cells are in a logic state of 1 (or 0), and the other memory cells are in a logic state of 0 (or 1).

Since the coding ions are implanted into the coding layer between the gates and the word line, the dopants do not diffuse to the buried bit lines to decrease the electric current in the buried bit lines. Meanwhile, the buried bit lines are not affected even with misalignments or CD deviations of the coding mask, so phase shift masks (PSM) or optical proximity correction (OPC) procedures are not required.

Accordingly, this invention is capable of increasing the margin of the Mask ROM coding process.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

FIG. 1A~1D illustrate a process flow of fabricating a Mask ROM according to a preferred embodiment of this invention in a perspective view.

Figure 1A:
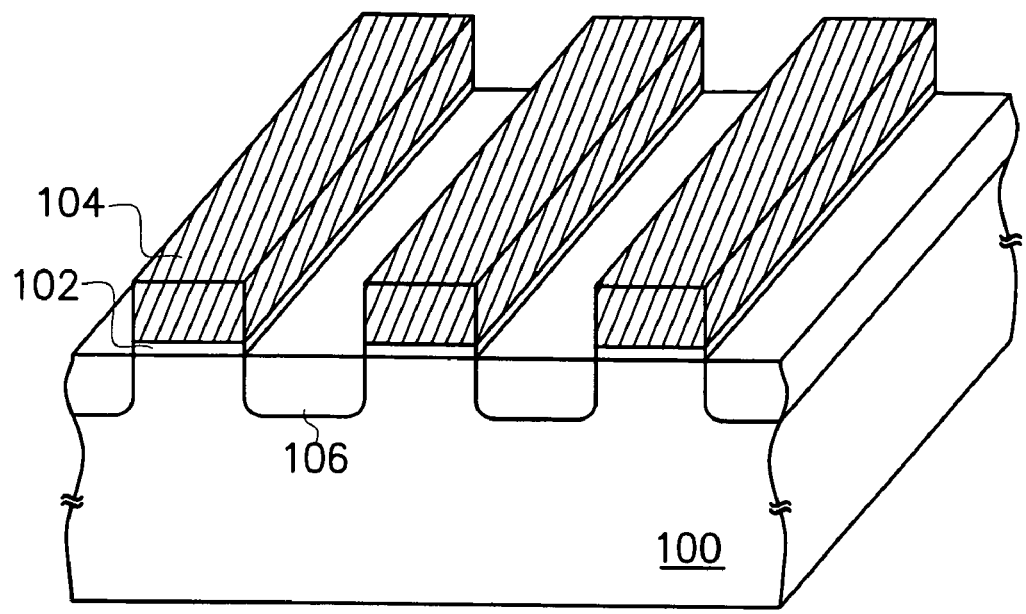
FIG. 1A~1D illustrate a process flow of fabricating a Mask ROM according to a preferred embodiment of this invention in a perspective view.

Refer to FIG. 1A, a substrate 100 is provided, and then a gate oxide layer 102 and a plurality of strip conductive structures 104 are formed on the substrate 100, wherein the strip conductive structures 104 comprise a material such as polysilicon. The method for forming the gate oxide layer 102 and the strip conductive structures 104 may be the one described below. A thin oxide layer (not shown) and a conductive layer (not shown) are sequentially formed on the substrate 100, and then the conductive layer and the thin oxide layer are patterned into the strip conductive structures 104 and the gate oxide layer 102, respectively.

Thereafter, an ion implantation is performed using the strip conductive structures 104 as a mask to form a plurality of buried bit lines 106 in the substrate 100 between the strip conductive structures 104.

Figure 1B:
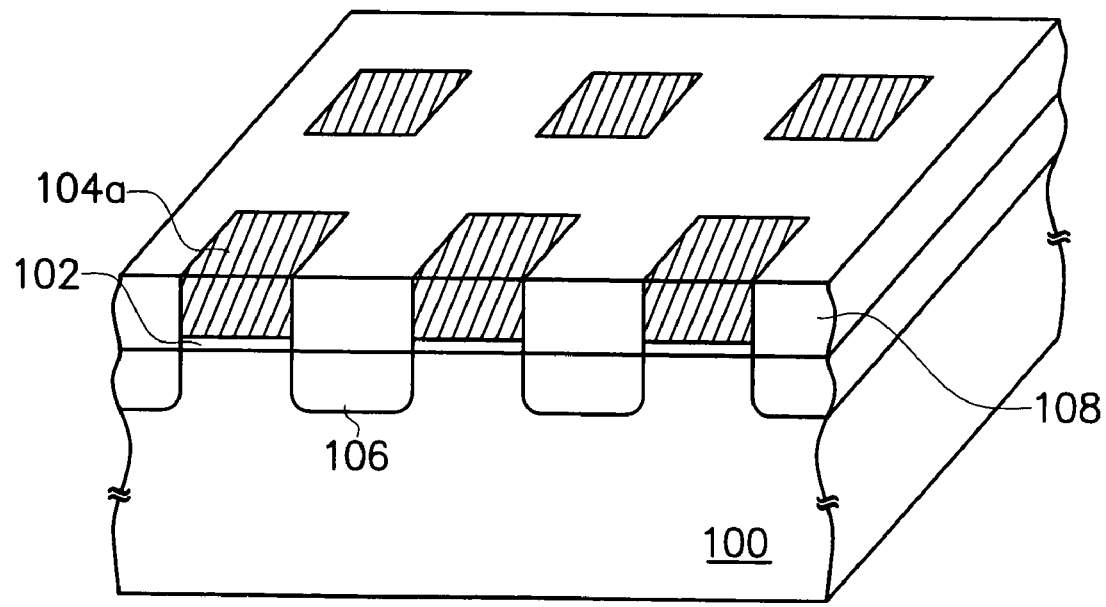

Refer to FIG. 1B, the strip conductive structures 104 are patterned perpendicular to the buried bit lines 106 to form a plurality of gates 104a. An insulator 108 is formed on the buried bit lines 106 and between the gates 104a to electrically isolate the gates 104a from each other and from the buried bit lines 106. The insulator 108 is formed by, for example, forming an insulating layer (not shown) on the substrate covering the gates 104a and then performing a CMP process or an etching-back process to remove a portion of the insulating layer until the gates 104a are exposed.

Figure 1C:
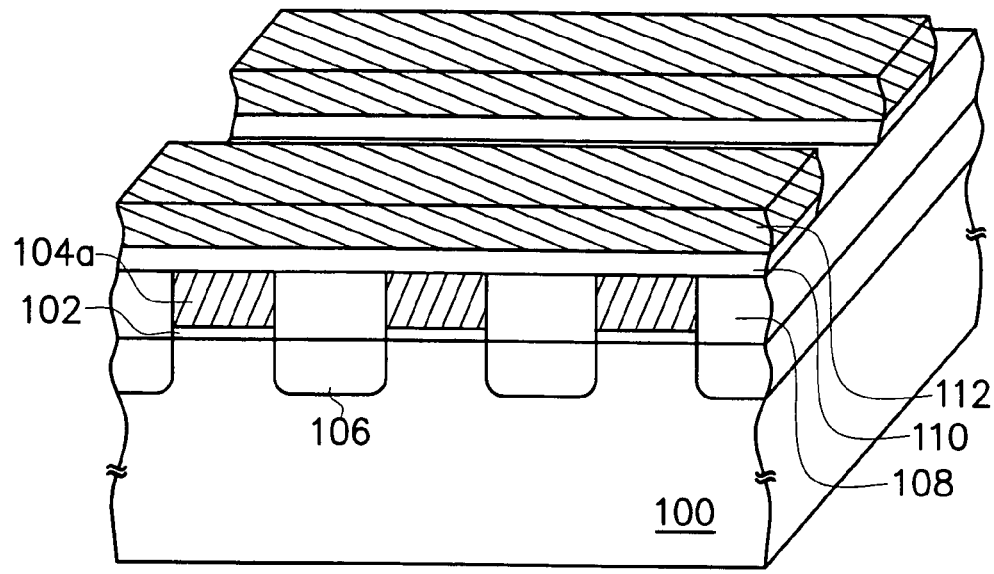

Refer to FIG. 1C, a coding layer 110 and a plurality of word lines 112 thereon are formed over the substrate 100, wherein each word line 112 is located over a row of gates 104a and the insulator 108. Meanwhile, the coding layer 110 between the word lines 112 and the gates 104a constitutes the coding regions of a plurality of memory cells. The word lines 112 and the coding layer 110 are formed by, for example, sequentially forming a global material layer (not shown) and a global conductive layer (not shown) covering the gates 104a and the insulator 108, and then patterning the two perpendicular to the buried bit lines 106. The coding layer 110 comprises a material such as a semiconductor material like undoped polysilicon, and the word lines 112 comprise a material such as doped polysilicon.

Figure 1D:
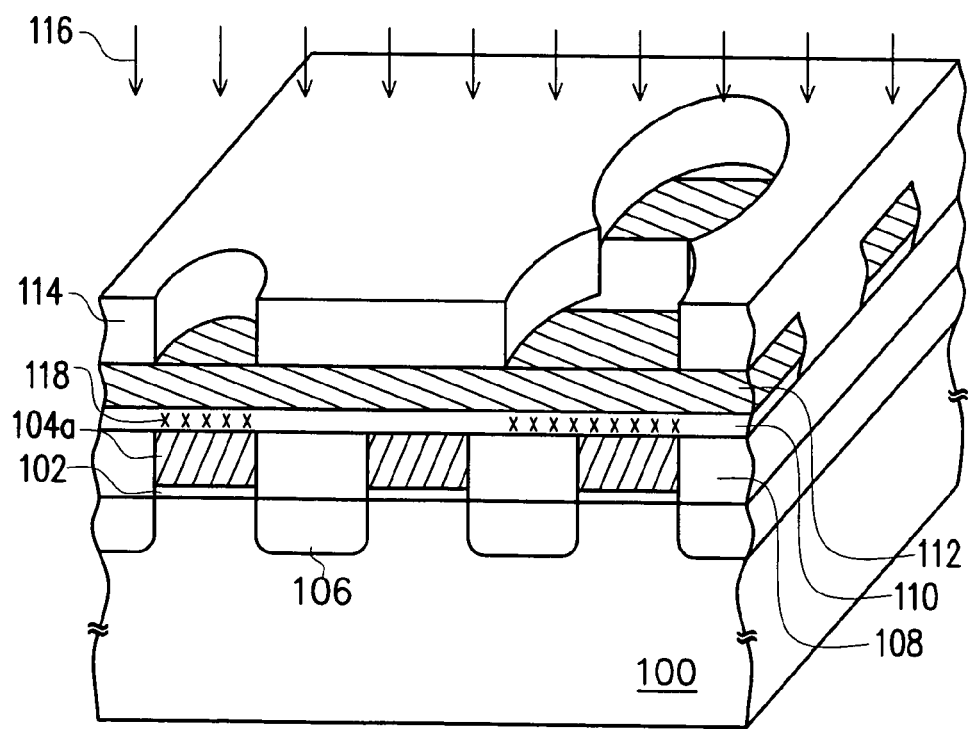

Refer to FIG. 1D, a coding mask 114 is formed over the substrate 100 exposing portions of the word lines 112. An ion implantation 116 is performed using the coding mask 114 as a mask to implant coding ions 118 into selected memory cells in the coding layer 110. The selected memory cells implanted with coding ions 118 are in a logic state of 1 (or 0), and the memory cells not implanted with coding ions are in a logic state of 0 (or 1). The coding ions 118 used to dope the coding layers 110 are preferably $PH_3$ ions.

It is noted that the phosphorous dopants converted from $PH_3$ ions do not diffuse easily to cause coding errors in the preferred embodiment of this invention, so $PH_3$ ions are more preferable in the implantation process as compared with boron ions used in the prior art.

Refer to FIG. 1D, the Mask ROM according to the preferred embodiment of this invention comprises a substrate 100, a gate oxide layer 102, a plurality of gates 104a, a plurality of buried bit lines 106, an insulator 108, a plurality of word lines 112 and a coding layer 110. The gates 104a are disposed on the substrate 100, and the gate oxide layer 102 is disposed between the substrate 100 and the gates 104a. The buried bit lines 106 are located in the substrate 100 between the gates 104a, and the insulator 108 is disposed on the buried bit lines 106 and between the gates 104a. Each word line 112 is disposed over a row of gates 104a and the insulator 108 perpendicular to the buried bit lines 106. The coding layer 110 is disposed between the word lines 112 and the gates 104 to constitute the coding regions of a plurality of memory cells. The memory cells implanted with coding ions 118 are in a logic state of 1 (or 0), and the memory cells not implanted with coding ions are in a logic state of 0 (or 1).

In the preferred embodiment, the coding ions are not implanted into selected channel regions between the buried bit lines 106, but are implanted into selected regions in the coding layer 110 on the gates 104a. Therefore, the dopants do not diffuse to the buried bit lines to decrease the electric current in the buried bit lines. Meanwhile, a misalignment to the selected memory cells in the coding layer 110 can be tolerated since implanting ions into the coding layer 110 on the insulator 108 does not affect the coding accuracy. Accordingly, this invention is capable of increasing the margin of a Mask ROM coding process. Furthermore, since a precise alignment to the selected memory cells is not required, the CD deviations of coding windows over the dense regions and the sparse regions do not affect the coding accuracy. Therefore, the yield of the Mask ROM can be improved.

In summary, with the Mask ROM structure of this invention and the method for fabricating the same, the dopants do not diffuse to the buried bit lines to decrease the electric current in the buried bit lines. Meanwhile, since the buried bit lines are not affected even with the misalignments or CD deviations of the coding mask layer, phase shift masks (PSM) or optical proximity correction (OPC) procedures are not required. Accordingly, this invention is capable of increasing the margin of the Mask ROM coding process.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims and their equivalents.

What is claimed is:

1. A method for fabricating a Mask ROM, comprising:
   forming a gate oxide layer on the substrate;
   forming a strip conductive structure on the gate oxide layer;
   forming a buried bit line in the substrate beside the strip conductive structure;
   patterning the strip conductive structure perpendicular to the buried bit line to form a plurality of gates;
   forming an insulator on the buried bit lines and between the gates;

forming a coding layer and a word line thereon over the substrate perpendicular to the buried bit line, wherein the word line is formed over a gate and the insulator, and a portion of the coding layer between the gate and the word line constitutes a coding region of a memory cell;

forming a coding mask over the substrate; and performing an implantation using the coding mask as a mask to dope the coding regions of selected memory cells, wherein after the implantation, the selected memory cells are in a logic state of 1 (or 0), and the other memory cells are in a logic state of 0 (or 1).

2. The method of claim 1, wherein the coding layer comprises a semiconductor material.

3. The method of claim 2, wherein the semiconductor material includes undoped polysilicon.

4. The method of claim 1, wherein the word line comprises doped polysilicon.

5. The method of claim 1, wherein the coding ions comprise $PH_3$ ions.

6. The method of claim 1, wherein forming the insulator comprises:

forming an insulating layer on the substrate covering the gates; and performing an etching-back process or a chemical mechanical polishing (CMP) process to remove a portion of the insulating layer until the gates are exposed.

7. The method of claim 1, wherein the insulator comprises silicon oxide.

8. The method of claim 1, wherein forming the coding layer and the word line comprises:

forming a material layer on the gates and the insulator;

forming a conductive layer on the material layer; and patterning the conductive layer and the material layer to form the word line perpendicular to the buried bit lines and the coding layer under the word line.

9. The method of claim 1, wherein forming the buried bit line comprises performing an ion implantation using the strip conductive structure as a mask.

* * * * *